United States Patent
Davies et al.

(10) Patent No.: US 9,356,425 B2
(45) Date of Patent: May 31, 2016

(54) SEMICONDUCTOR DBR LASER

(71) Applicant: Oclaro Technology Ltd, Northamptonshire (GB)

(72) Inventors: Sam Davies, Northamptonshire (GB); Andrew Ward, Northamptonshire (GB); Andrew Carter, Northamptonshire (GB)

(73) Assignee: OCLARO TECHNOLOGY LTD, Northamptonshire (GB)

( * ) Notice: Subject to any disclaimer, the term of this patent is extended or adjusted under 35 U.S.C. 154(b) by 0 days.

(21) Appl. No.: 14/437,249

(22) PCT Filed: Nov. 1, 2013

(86) PCT No.: PCT/GB2013/052873
§ 371 (c)(1),
(2) Date: Apr. 21, 2015

(87) PCT Pub. No.: WO2014/068332
PCT Pub. Date: May 8, 2014

(65) Prior Publication Data
US 2015/0288140 A1 Oct. 8, 2015

(30) Foreign Application Priority Data

Nov. 1, 2012 (GB) .................................. 1219694.5

(51) Int. Cl.
*H01S 5/0625* (2006.01)
*H01S 5/026* (2006.01)
(Continued)

(52) U.S. Cl.
CPC ........... *H01S 5/06256* (2013.01); *H01S 5/0261* (2013.01); *H01S 5/101* (2013.01);
(Continued)

(58) Field of Classification Search
CPC . H01S 5/06256; H01S 5/1064; H01S 5/0261; H01S 5/101; H01S 5/1014; H01S 5/1212; H01S 5/125; H01S 5/02407
USPC .......................... 372/43.01, 46.011, 50.11, 99
See application file for complete search history.

(56) References Cited

U.S. PATENT DOCUMENTS 5,392,308 A 2/1995 Welch et al.
6,345,135 B1 2/2002 Reid et al.
(Continued)

FOREIGN PATENT DOCUMENTS

EP 1 413 023 4/2004
GB 2 433 160 A 6/2007
(Continued)

OTHER PUBLICATIONS

Bozorgui S et al: "Chirped grating DBR lasers using bent waveguides", LEOS '95. IEEE Lasers and Electro-Optics Society 1995 Annual. Meeting. 8th Annual Meeting. Conference Proceedings ,Oct. 30-31, 1995; San Francisco, CA., USA, IEEE, New York, NY, USA, vol. 1,Oct. 30, 1995~ pp. 264-265, XP010t53484, DOI 10. 1109/LEOS.*

(Continued)

*Primary Examiner* — Dung Nguyen
(74) *Attorney, Agent, or Firm* — Fenwick & West LLP

(57) ABSTRACT

A semiconductor distributed Bragg reflector laser configured for single longitudinal mode operation, having an optical waveguide comprising an optical gain section, a first reflector being a first distributed Bragg reflector (DBR) section comprising a grating configured to produce a reflection spectrum having one or more first reflective peaks, and a second reflector, wherein the first DBR section is configured to compensate for thermal chirp that is induced inhomogeneously along the length of the DBR section, in use.

19 Claims, 4 Drawing Sheets

(51) Int. Cl.
*H01S 5/10* (2006.01)
*H01S 5/12* (2006.01)
*H01S 5/024* (2006.01)
*H01S 5/125* (2006.01)

(52) U.S. Cl.
CPC ............ *H01S 5/1014* (2013.01); *H01S 5/1064* (2013.01); *H01S 5/1212* (2013.01); *H01S 5/02407* (2013.01); *H01S 5/125* (2013.01); *H01S 5/1246* (2013.01); *H01S 2301/163* (2013.01)

(56) References Cited

U.S. PATENT DOCUMENTS

| 7,145,923 B2 | 12/2006 | Carter et al. |
| 2010/0260215 A1* | 10/2010 | Nguyen ............ H01S 5/06256 372/22 |
| 2010/0265980 A1 | 10/2010 | Matsuda |
| 2013/0016753 A1 | 1/2013 | Shigihara |

FOREIGN PATENT DOCUMENTS

| WO | WO 02/075867 A2 | 9/2002 |
| WO | WO 03/012936 A2 * | 2/2003 |
| WO | WO 2010/120665 A1 | 10/2010 |
| WO | WO 2013/030550 A2 | 3/2013 |

OTHER PUBLICATIONS

Bozorgui, S., et al., Chirped Grating DBR Lasers using Bent Waveguides, In Proceedings of the 8$^{th}$ Annual IEEE Lasers and Electro-Optics Society Annual Meeting, New York, NY, USA, Oct. 30, 1995, vol. 1, pp. 264-265, XP010153484.

Intellectual Property Office of the United Kingdom, Patents Act 1977: Search Report under Section 17(5), United Kingdom Patent Application No. GB1219694.5, Mar. 4, 2013, 4 Pages.

Patent Cooperation Treaty, International Search Report and Written Opinion of the International Searching Authority, International Patent Application No. PCT/GB2013/052873, May 26, 2014, 14 Pages.

\* cited by examiner

SEMICONDUCTOR DBR LASER

RELATED APPLICATIONS

This application is a 35 U.S.C. 371 national stage filing of International Application No. PCT/GB2013/052873, filed on Nov. 1, 2013, which claims priority to United Kingdom Patent Application No. 1219694.5, filed on Nov. 1, 2012. The contents of the aforementioned applications are hereby incorporated by reference.

The present invention relates to semiconductor distributed Bragg reflector lasers that are configured for lasing operation on a single longitudinal cavity mode, and more particularly, but not exclusively, to widely wavelength tunable distributed Bragg reflector lasers.

BACKGROUND

Semiconductor lasers are known that are configured to lase on a single longitudinal mode of the laser cavity, with the lasing mode and its wavelength being selected by a distributed Bragg reflector grating (DBR) having a narrow reflective peak. Such single longitudinal mode lasers have a side mode suppression ratio (SMSR) of at least 25 dB.

DBR lasers configured to operate at a fixed wavelength or to be tunable over a narrow wavelength range typically comprise a laser cavity defined between a broadband reflector (e.g. a broadband facet reflector) and a DBR section, and have within the laser cavity an optical gain section and typically a phase control section. The gain section is electrically driven to emit light by stimulated emission. The DBR section has a single, constant pitch grating configured to reflect light with a reflection spectrum having a single narrow reflective peak, with a full-width at half maximum that is equivalent to only a very small number of longitudinal cavity modes of the laser (e.g. less than five times the mode spacing, and preferably less than three times the mode spacing), which provides high mode selectivity and a correspondingly high SMSR. The phase control section has a tunable refractive index, with which to make fine adjustments to the optical path length of the optical cavity of the laser, in use, to control the relative alignment of the fine comb of laser cavity modes with respect to the narrow reflective peak of the DBR section's reflection spectrum (i.e. controlling the spectral operating position within the range of dominance of a particular cavity mode), in order to select the preferred lasing mode and to optimise its alignment with the reflective peak, in order to reduce the relative intensity of unwanted side modes. The wavelength tuning range of such lasers is limited by the maximum refractive index change that can be induced in the DBR section, which changes the effective pitch of the grating at the operating wavelength. The spectral width of a reflective peak narrows with increasing effective penetration length of the DBR section, and so for single longitudinal cavity mode operation, such DBR lasers have lengthy DBR sections.

Widely wavelength tunable DBR lasers are configured for tuning to lase across a wider wavelength range than is possible solely by tuning of the refractive index of a DBR having a single, constant pitch, and typically use two different, independently tunable DBR sections. Accordingly, such lasers typically have longer laser cavities than fixed wavelength or narrowly wavelength tunable DBR lasers, which consequently have greater sensitivity to their operating parameters, in particular with regard to stabilising the control of the lasing modes to avoid mode-hopping (jumping between lasing on different longitudinal cavity modes).

One such type of widely wavelength tunable DBR laser has a laser cavity formed between two DBR sections that produce reflection spectra of differently spaced combs of reflective peaks, which can be spectrally tuned relative to one another in a Vernier type of tuning arrangement, with lasing occurring at a wavelength common to both of the combs of reflective peaks (like the DBR laser with a pair of Vernier tunable phase-change gratings that is shown in FIG. 8 of U.S. Pat. No. 6,345,135). The DBR section at the output end of the laser typically has spectrally wider reflective peaks than the reflective peaks of the other DBR section.

A second such type of widely wavelength tunable DBR laser has a laser cavity formed between a first DBR section that produces a comb of narrow reflective peaks and a second DBR section that has a broad spectral band of reflectivities (e.g. a relatively uniform plateau) in the untuned state, but within which part of the reflection spectrum is wavelength tunable to overlap with another part, to produce a reinforced reflective peak that is several times broader (i.e. FWHM) than the narrow reflective peaks of the second DBR section, but narrower than the spectral separation of successive narrow peaks. This reinforced peak selects a narrow peak from the first comb-like reflection spectrum at which the laser will lase. Such a laser is described in U.S. Pat. No. 7,145,923.

As the spectral width of a reflective peak narrows, with increasing length of the corresponding DBR section, in both cases, the DBR section that is responsible for producing the narrow reflective peaks is longer than the DBR section producing the wider reflectiv peak(s).

A DBR section will reflect and transmit light in accordance with its reflection spectrum. However, a DBR section will also, undesirably, absorb some of the light incident into it. To minimise the absorption loss when light leaves the laser cavity, and to maximise the optical power output from the laser cavity, the long DBR section that has the narrow reflective peaks is typically the rear reflector of the laser cavity (i.e. at the opposite end of the laser cavity from the main beam output, at the front reflector).

In use, aside from heat generated in the sections of a DBR laser by the currents that drive the respective sections, heat is also generated in the DBR sections by optical absorption. Whilst heat is dissipated from the laser's optical waveguide, and is typically absorbed by a thermo-electric cooler (Peltier cooler) that is thermally coupled to the semiconductor chip, the rate of dissipation is not sufficient to avoid the creation of a thermal gradient in the DBR section, which affects the optical performance of the laser. In a DBR section, the local level of optical absorption induced heating corresponds to the local intensity of light, which decays approximately exponentially, throughout the DBR section, away from the optical gain section.

The effective refractive index of a semiconductor optical waveguide varies as a function of temperature. The inhomogeneous optical absorption in a DBR section induces corresponding inhomogeneous heating in the waveguide and consequently a corresponding variation in the effective pitch of the grating, in use. Further, thermal cross-talk from other sections, in particular from the gain section, can induce further inhomogeneous heating in a DBR section. Such optical absorption and thermal cross-talk may raise the temperature of the end of the DBR section that is closest to the gain section by 5° C. and the end of the DBR section that is furthest from the gain section by 1° C., for example, although the heating effect is greatest closest to the gain section, where it also increases most rapidly, towards the gain section. Thermal inhomogeneity induces inhomogeneity of the effective grating pitch in the DBR section, since the reflective wavelength of a grating may tune by about 0.1 nm/° C., and the effective chirp of the grating is greatest at the end of the DBR section closest to the gain section (e.g. approximately $3 \times 10^{-4}$ nm/μm, along the part of the DBR section closest to the gain section). This effective inhomogeneity of the effective grating pitch broadens the width of a DBR section's reflective peak(s), reducing the optical performance of the laser under particular operating conditions (high gain section current and/or high DBR section tuning current). The effect of inhomogeneous thermally induced chirp is particularly significant in a DBR section that has a narrow reflective peak/peaks, and which is longer to provide a higher reflectivity.

The inhomogeneous thermally induced chirp in a DBR section that has a reflective spectrum of one or more narrow reflective peaks degrades the side mode suppression ratio (SMSR).

SUMMARY OF THE DISCLOSURE

According to a first aspect, there is provided a semiconductor distributed Bragg reflector laser configured for single longitudinal mode operation, having an optical waveguide comprising an optical gain section, a first reflector being a first distributed Bragg reflector (DBR) section comprising a grating configured to produce a reflection spectrum having one or more first reflective peaks, and a second reflector, wherein the first DBR section is configured to compensate for thermal chirp that is induced inhomogeneously along the length of the DBR section, in use.

According to a second aspect, there is provided an optical transmitter module comprising a laser according to the first aspect.

Advantageously, such a first DBR section may compensate for inhomogeneous heating induced by optical absorption and/or thermal cross-talk from another section, producing a first DBR section that, in use, has substantially no effective chirp or reduced effective chirp relative to prior DBR sections. Further, such a single longitudinal mode laser may have an enhanced side mode suppression ratio (SMSR). Yet, further, such a laser may have a shorter DBR section, without reducing the optical performance of the corresponding DBR section. Preferably the compensation varies monotonically and continuously along the length of the DBR section.

The laser may be configured for the full width half maximum of the first reflective peak to be narrower than five times the longitudinal mode spacing at the operating wavelength or across the range of operating wavelengths. The laser may be configured for the full width half maximum of the first reflective peak to be narrower than three times the longitudinal mode spacing at the operating wavelength or across the range of operating wavelengths.

The grating of the first DBR section may have a built-in effective chirp.

The built-in effective chirp may be less than 0.5% along the first DBR section, preferably less than 0.3% more preferably less than 0.2% or less than 0.1%.

The built-in effective chirp may be an exponential growth function along the length of the first DBR section away from the gain section. The built-in effective chirp may be a linear growth function along the length of the first DBR section away from the gain section. The built-in effective chirp may be a composite growth function along the length of the first DBR section away from the gain section comprising at least a first portion adjacent the gain section having a first linear growth function and a section portion having either a lower second linear growth function or no built-in effective chirp. Accordingly, one or more linear portions of successively decreasing built-in effective chirp may be approximated to an ideal (e.g. exponential) growth function.

The grating of the first DBR section may have a constant pitch. Built-in effective chirp may be provided by varying a property of the waveguide along the length of the first DBR section.

The first DBR section may comprise an optical waveguide having a grating with a chirped physical pitch. The variation in physical grating pitch may be less than 0.5% along the length of the first DBR section, preferably less than 0.3%, more preferably less than 0.2% or less than 0.1%.

The first DBR section may have a waveguide width that increases away from the end of the first DBR section closest to the gain section. The waveguide may be a ridge waveguide (e.g. a weakly guiding ridge waveguide, in which the ridge is not etched through the optical guiding layer). In the case that the waveguide is defined by a ridge waveguide, the width of the base of the ridge of the ridge waveguide may increase by up to 50% along the length of the first DBR section, and preferably between 10% and 30%. The variation in waveguide width may induce a variation in effective refractive index (phase index) of the optical waveguide by less than 0.5% along the first DBR section, preferably less than 0.3% and more preferably less than 0.2%. It is noted that increasing the ridge waveguide width increases the phase refractive index and decreases the group refractive index by approximately equal proportions.

The waveguide width may increase along the length of the first DBR section substantially as an exponential growth function (e.g. with a built-in effective chirp of 0.05 to 0.1% along the length of the DBR section).

The waveguide width may increase linearly along the length of the first DBR section (e.g. with a built-in effective chirp of 0.1 to 0.2% along the length of the DBR).

The first DBR section may comprise a curved optical waveguide and the grating may have grating lines that are parallel. Advantageously, such a first DBR section may reduce the length of the semiconductor chip on which the laser is formed, where a curved waveguide is provided adjacent the edge of the chip to reduce back reflections from the facet (e.g. curved to meet the facet at about 7° from the perpendicular, in the case of InP-based semiconductor materials).

The first DBR section may comprise a temperature control element configured to heat or cool the first DBR section inhomogeneously along the length of the first DBR section.

The temperature control element may be a tapered resistive heating element provided along or alongside the optical waveguide in the first DBR section. The resistive heating element may be configured to provide greater heating to the waveguide in the first DBR section away from the gain section than proximate to the gain section. The rate of thermal dissipation per unit length may increase away from the gain section according to an exponential growth function, linearly, or in accordance with an approximation to an exponential growth function.

The optical waveguide may comprise a ridge optical waveguide.

The second reflector may comprise a broadband reflector.

The laser may comprise a second DBR section configured to produce a second reflection spectrum having at least one second reflective peak, and the or each first reflective peak may have a narrower full width half maximum than the or each second reflective peak.

The laser may comprise a phase control section.

BRIEF DESCRIPTION OF THE DRAWINGS

Embodiments of the invention are further described hereinafter with reference to the accompanying drawings, in which.

DETAILED DESCRIPTION

In the described embodiments, like features have been identified with like numerals, albeit in some cases having one or more of: increments of integer multiples of 100 and typographical marks (e.g. primes). For example, in different figures, 100, 200, 200', 300 and 400 have been used to indicate a single longitudinal mode DBR laser.

Figure 1A:
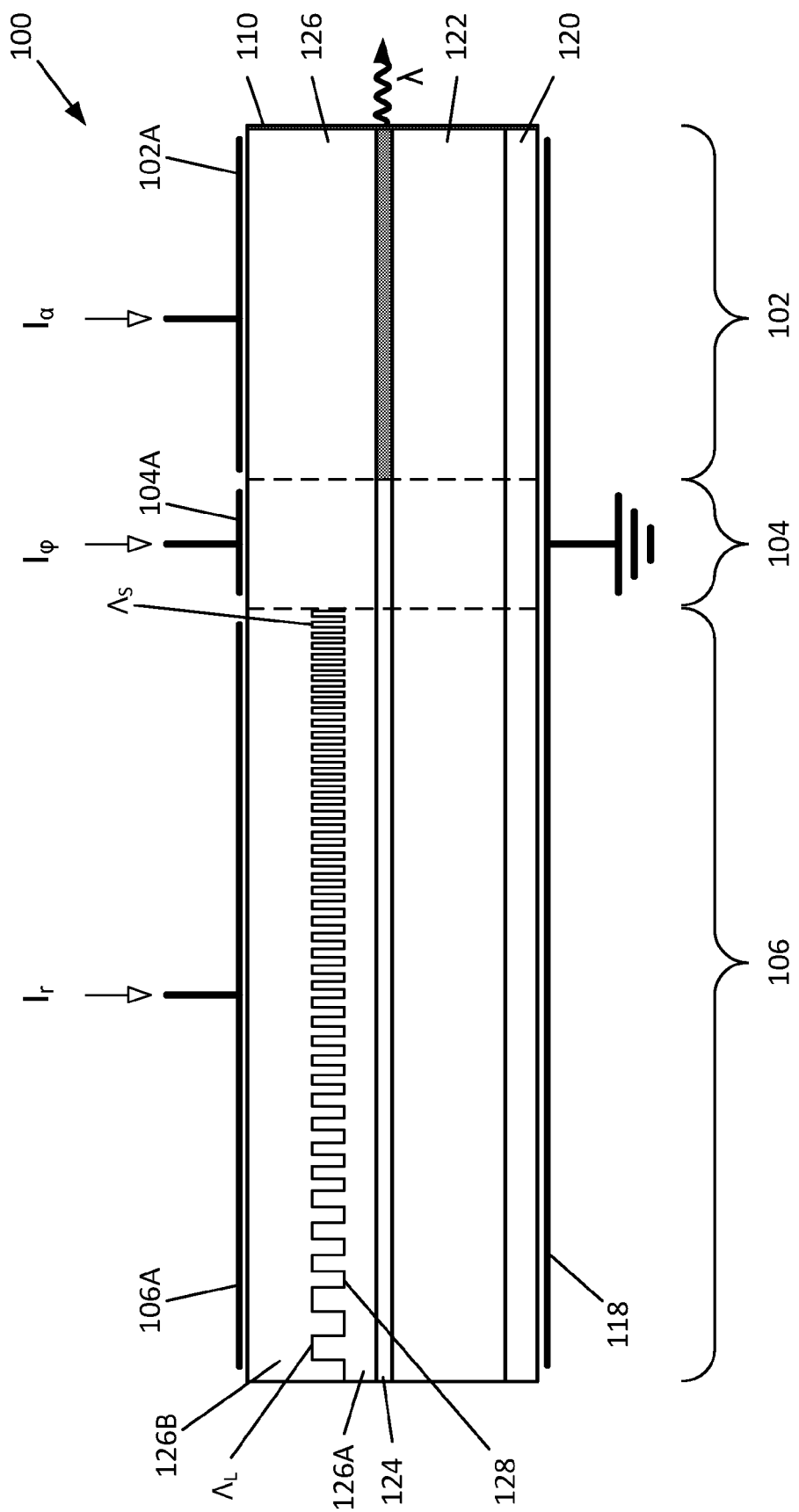
FIG. 1A shows a schematic side view of a three-section, single mode DBR laser according to the present invention, having a chirped grating in the DBR section.

FIG. 1A illustrates the structure of a three-section single mode distributed Bragg reflector (DBR) laser 100 comprising an optical gain section 102 and a phase control section 104 that are within a laser cavity (in use) formed between a DBR section 106 (first laser cavity end reflector) and a broadband front facet reflector 110 (second laser cavity end reflector). The gain, phase and DBR sections 102, 104 and 106 have respective control electrodes 102A, 104A and 106A arranged to drive control currents $I_\alpha$, $I_\phi$, $I_r$ through the laser's optical waveguide to a common ground electrode 118.

The laser 100 is a laser diode structure formed on a semiconductor chip having a substrate 120, oppositely doped lower and upper layers 122 and 126, and an intervening undoped optical guiding layer 124. Lateral optical guiding may be provided by etching a ridge into the surface of the semiconductor chip, on the side opposite to the substrate 120. For a weakly guiding ridge waveguide, the ridge is etched part way through the upper layer 126, but not through the optical guiding layer 124.

The upper layer 126 in the DBR section 106 comprises a first material 126A that has been etch-patterned and overgrown with a second material 126B having a different refractive index, to form a distributed Bragg reflective optical grating 128.

The grating 128 optically overlaps with light travelling along the optical waveguide of the laser 100, in the DBR section 106, guided by the optical guiding layer 124. The optical waveguide in the DBR section 106 of the laser in FIG. 1A has a constant width. The grating 128 has a built-in chirp, having a physical grating pitch that varies monotonically and continuously along the length of the grating from $\Lambda_S$ to $\Lambda_L$. In the illustrated embodiment, the pitch of the grating 128 varies by less than 0.5% (e.g. approximately 0.15%), with a uniform variation in grating pitch along the length of the DBR section 106. The grating 128 may be formed by a lithographic etching process that uses a holographically written etch mask, or an etch mask that is directly written by a photolithographic or e-beam process.

Ideally, the pitch of the grating 128 in the DBR section 106 increases complementarily to the inhomogeneous refractive index change caused by the temperature profile of the DBR section 106 in use (e.g. complementary to the optical absorption profile and thermal cross-talk of the DBR section). The optical absorption is approximately an exponential decay function, in the case that the optical absorption is the dominant heating effect, and the pitch of the grating may be chosen to increase, away from the gain section, approximately as an exponential growth function. However, alternatively, for convenience of manufacture, the chirp may be approximated to a linear increase in grating pitch, increasing in pitch away from the gain section, as is shown schematically in FIG. 1A. Since the optical intensity is greatest within the portion of the DBR section closest to the gain section, this is the portion in which the pitch has the greatest effect on the optical performance of the laser, and so the choice of a linear pitch may be particularly weighted towards compensating for the variation in optical absorption heating and thermal cross-talk heating along the waveguide, in this portion. Since the temperature gradient will increase up to a maximum at the end of the DBR section closest to the gain section, the total chirp along the length of the DBR section would typically be significantly smaller for an exponentially shaped chirp (e.g. two- or three-times smaller, e.g. 0.05 to 0.1%) than for a linear chirp. In a further alternative, the pitch may increase linearly close to the gain section, and at a lower rate or not at all in a second portion further from the gain section, providing a grating that approximates to the optical performance of the exponential growth function, whilst being more easily manufactured (and other intervening portions may be provided to improve the approximation).

It will be appreciated that built-in chirp that has been provided in the grating 128 of the DBR section 106 compensates for thermally induced chirping effects, that arise in use at typical operating powers (i.e. well above the lasing threshold), due to optical absorption in the DBR section 106 and heat conducted into the DBR section from other sections 102 and 104 of the laser 100 (or even from a semiconductor optical amplifier to which it is optically coupled and monolithically integrated on the same semiconductor chip). Accordingly, at the lasing threshold, which is well below the typical operating power, the built-in chirp produces a wider peak in the reflective spectrum of the DBR, than that of a corresponding unchirped grating.

Figure 1B:
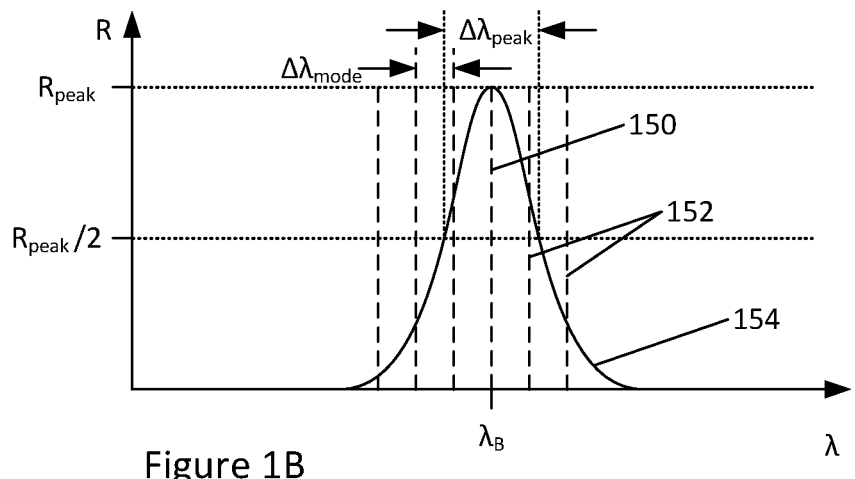
FIG. 1B shows the reflection spectrum of the DBR section of the laser of FIG. 1A at the lasing threshold.
Figure 1C:
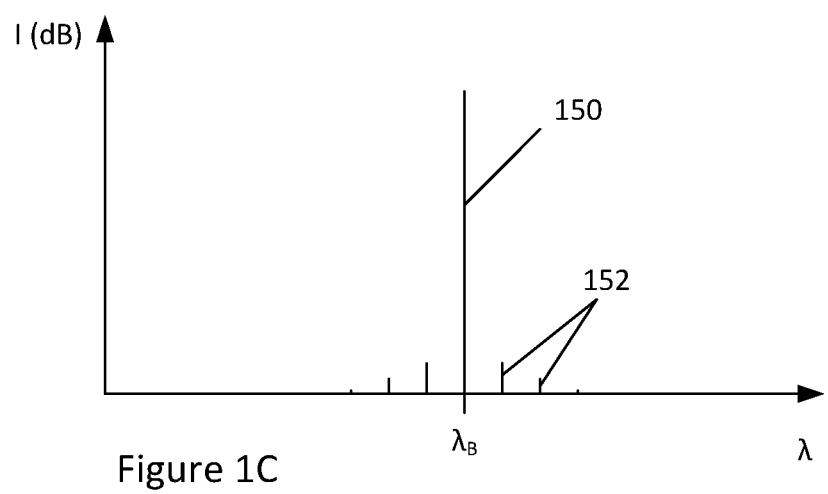
FIG. 1C shows the emission spectrum of the DBR laser of FIG. 1A in use at typical operating powers, well above the lasing threshold.

The laser 100 is configured for operation on a single longitudinal cavity mode of the laser, having a side mode suppression ratio (SMSR) for the largest side mode of at least 25 dB (and preferably at least 35 dB). The reflection (intensity) spectrum of the DBR section 106 is shown in FIG. 1B, and the wavelength $\lambda_B$ of the lasing mode 150 and the wavelengths of side modes 152 are indicated. The reflection spectrum has a single narrow reflective peak 154, having a peak width $\Delta\lambda_{peak}$ (i.e. the full width half maximum, FWHM) that is less than five times the longitudinal mode spacing $\Delta\lambda_{mode}$ (and preferably less than three times the longitudinal mode spacing). The corresponding intensity of the lasing mode 150 and the side modes 152 in the output from the laser are shown schematically in FIG. 1C.

The width of the reflection peak $\Delta\lambda_{peak}$ is given by:

$$\Delta\lambda_{peak} = \lambda_B^2 \cdot \frac{\kappa L}{\pi n_g L}$$

where L is the grating length, κ is the grating coupling coefficient, $n_g$ is the group index and $\lambda_B$ is the Bragg wavelength of the maximum of the peak.

The effective penetration length $L_{Eff}$ of the grating 128 in the DBR section is given by:

$$L_{Eff} = \frac{L}{2} \cdot \frac{\tanh \kappa L}{\kappa L}$$

So, the optical cavity length $L_{Total}$ is given by:

$$L_{Total} = n_{DBR} L_{Eff} + n_\alpha L_\alpha + n_\phi L_\phi$$

where $n_{DBR}$ is the effective refractive (phase) index of the DBR section 106, $n_\alpha L_\alpha$ is the product of the effective refractive (phase) index and length of the gain section 102, and $n_\phi L_\phi$ is the product of the effective refractive (phase) index and length of the phase control section 104.

The longitudinal mode spacing of the laser cavity is given by:

$$\Delta\lambda_{mode} = \frac{\lambda^2}{2 n_g L_{Total}}$$

As well as DBR lasers having only one DBR section (as per the illustrated three-section DBR laser of FIG. 1A), the present invention may also be applied to DBR lasers having both cavity end reflectors provided by DBR sections. In such lasers, one or both DBR sections may have a reflection spectrum comprising one or more narrow reflective peaks (i.e. having a peak width that is less than five times the longitudinal mode spacing), which are configured to compensate for thermal chirp that is induced inhomogeneously along the length of the DBR section, in use (e.g. physical chirp of the grating pitch, or effective chirp, as discussed below).

Figures 2A, 2B, 2C:
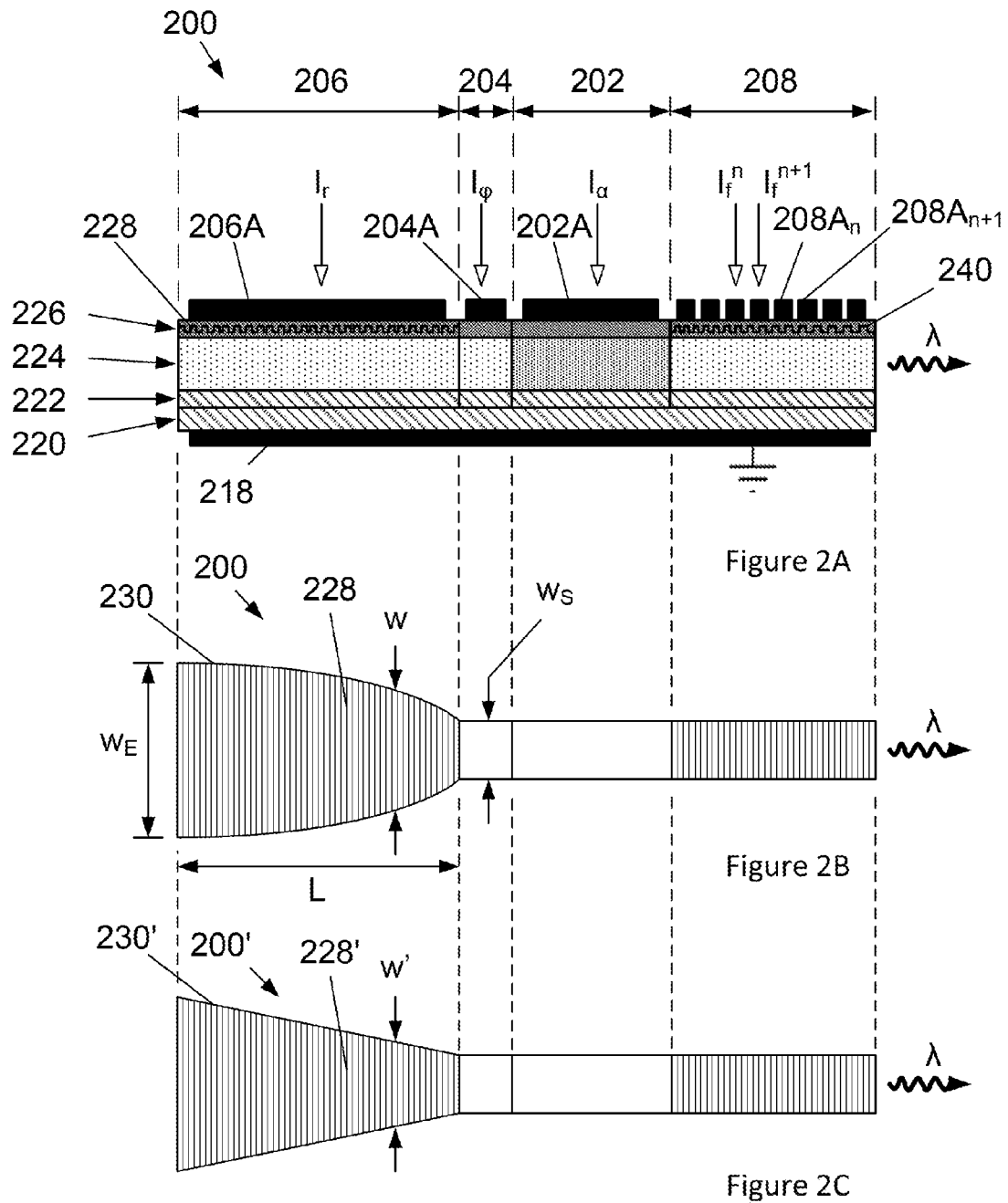
FIG. 2A shows a schematic side of a widely wavelength tunable four section DBR laser according to the present invention having a laterally tapered optical ridge waveguide in the first DBR section.
FIG. 2B shows a schematic plan view of the ridge waveguide of the laser of FIG. 2A, indicating the gratings in the DBR sections.
FIG. 2C shows a schematic plan view of an alternative four section DBR laser having an alternatively tapered optical waveguide in the first DBR section.

FIGS. 2A and 2B illustrate such a four-section single mode DBR laser 200. The laser 200 comprises an optical gain section 202 and a phase control section 204 in a laser cavity defined (in use) between the first DBR section 206 and a second DBR section 208.

The grating 228 in the first DBR section 206 of FIG. 2A has a constant physical grating pitch (which may be more convenient to manufacture than a variable physical pitch grating 128, as described in FIG. 1A). However, despite the constant physical pitch of the grating 228, light in the optical waveguide, guided by the optical guiding layer 224, experiences a monotonically and continuously increasing effective grating pitch as it travels along the optical waveguide away from the gain section (i.e. a built-in, monotonic effective chirp of the grating), due to a change in the effective refractive index of the optical waveguide (e.g. the refractive index that is locally experienced by light transmitted along the waveguide) along the first DBR section, due to a change in the waveguide width w along its length (i.e. tapering of the lateral width w of the ridge 230 of the optical waveguide). To most closely compensate for the inhomogeneity in optical absorption in the DBR section 206, the width w of the ridge 230 of the DBR section increases (away from the gain section 202) substantially in accordance with an exponential growth function, e.g.

$$w(x) = w_s + (w_E - w_s) \cdot (1 - e^{-\alpha x})$$

with the w width varying between a start width $w_s$ and an end width $w_E$, as shown in FIG. 2B.

Alternatively, the tapering of the width of the ridge waveguide may be approximated to a linear increase in the width w' of the ridge waveguide width 230', extending away from the gain section, as illustrated in FIG. 2C. Such a linearly tapered design may be more conveniently manufactured. In the illustrated embodiment, the waveguide is a weakly-guiding ridge waveguide (e.g. a shallow etched ridge that is not etched through the optical guiding layer) having a ridge width at the bottom of the ridge etch that tapers approximately as follows: from 2.1 μm to 2.5 μm over a length of 700 μm. In the illustrated embodiment, the change in effective refractive (phase) index of the optical waveguide varies by less than 0.5% (e.g. approximately 0.15%) along the length of the DBR section 206. Similarly to FIG. 1A, since the optical intensity is greatest within the portion of the DBR section closest to the gain section, this is the portion in which the effective pitch of the grating has the greatest effect on the optical performance of the laser, and so the choice of a linear taper of the waveguide width may be particularly weighted towards compensating for the variation in optical absorption heating and thermal cross-talk heating along the waveguide, in this portion. However, since the temperature gradient will increase up to a maximum at the end of the DBR section closest to the gain section, the total change in waveguide width along the length of the DBR section may be significantly smaller for a waveguide width that varies in accordance with an exponential growth function (e.g. two- or three-times smaller, e.g. 0.05 to 0.1%), compared with a linear waveguide width variation. In a further embodiment (not illustrated), the waveguide width of the first DBR section may approximate an exponential growth function, having a first tapered portion closest to the gain section, and a second portion that tapers more slowly or has a constant width (and other intervening portions may be provided to improve the approximation).

FIGS. 2A to 2C illustrate widely tunable DBR lasers 200 and 200', in which the first DBR section 206 comprises a grating 228 and 228' that produces a reflection spectrum having a plurality of narrow reflective peaks (i.e. full width half maximum is less than five times the longitudinal mode spacing). The second DBR section 208 has a chirped grating 240 (physical grating chirp is shown in FIG. 2A but not shown in FIGS. 2B and 2C) having a broad reflection spectrum, with sections that are each provided with a tuning electrode 208$A_n$, 208$A_{n+1}$, etc., for relative tuning of the sections to produce a relatively wide reflective peak. A single mode may then be selected from the relatively wide reflective peak of the second DBR, by coincidence with one of the narrow reflective peaks of the first DBR section 206, as is described in more detail in U.S. Pat. No. 7,145,923.

The grating 228 of the first DBR section 206 is a phase-change grating, similar to the phase-change grating disclosed in FIG. 1 of U.S. Pat. No. 6,345,135, which comprises a repeating pattern of grating sections having a uniform physical pitch, separated by phase changes (e.g. π). Alternatively, the grating may be similar to a sampled grating, which is a further known example of a grating producing a plurality of narrow reflective peaks, which comprises periodic bursts of grating and intervening gaps. However, in contrast to the prior art use of such gratings, in the corresponding DBR section of the present invention they are configured to compensate for thermal chirp that is induced inhomogeneously along the length of the DBR section, in use. Such configuration may be provided by a built-in chirp (e.g. a built-in physical chirp from a monotonic and continuous variation of the physical grating pitch, and/or a built-in effective chirp induced by a monotonic and continuous variation of the refractive (phase) index of the waveguide) or by the provision of inhomogeneous heating or cooling elements. In the case of a built-in chirp, it may be provided by a monotonic variation in the physical grating pitch (as per the grating 128 in the DBR 106 in the embodiment of FIG. 1A), or producing built-in effective chirp by modification of the waveguide geometry, as discussed in relation to FIGS. 2A to 3, below.

FIGS. 2A to 2C concern an arrangement in which a broad reinforced reflective peak is provided by selective spectral tuning of sections of the second DBR 208, and the lasing mode is selected by a narrow reflective peak of a comb of such peaks produced by the reflection spectrum of the first DBR section 206, as per U.S. Pat. No. 7,145,923.

Alternatively, both DBR sections may have a reflection spectrum comprising differently spaced combs of reflective peaks, providing a laser that is wavelength tunable in a Vernier-tuning arrangement. Such a DBR laser, having a pair of Vernier tunable phase-change gratings, is shown in FIG. 8 of U.S. Pat. No. 6,345,135. Alternatively, the DBR sections may comprise sampled gratings. In this case, the reflective peaks of one or both DBR sections are narrow reflective peaks (full width half maximum of less than five times the mode spacing, and preferably less than three times the mode spacing) that are configured to compensate for thermal chirp that is induced inhomogeneously along their length, in use.

Figure 3:
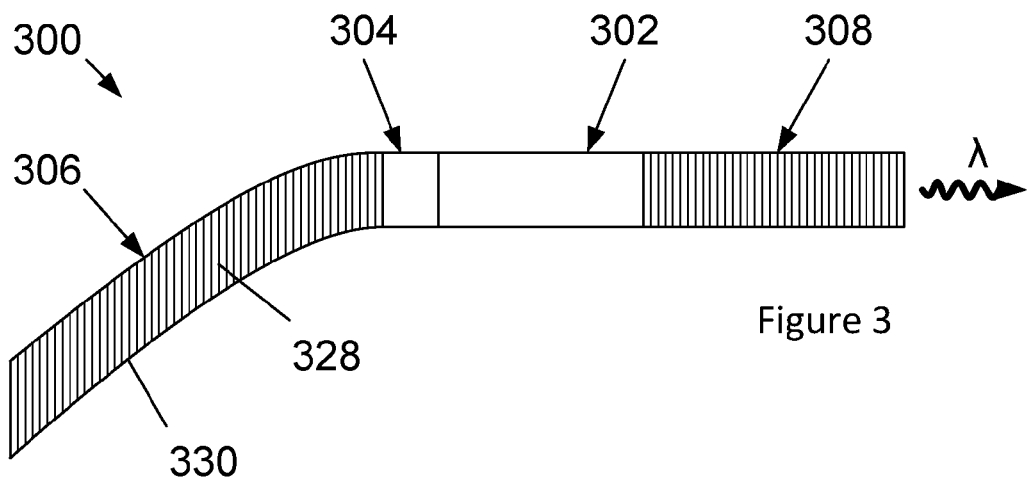
FIG. 3 shows a schematic plan view of a four section DBR laser according to the present invention, having a curved optical waveguide in the DBR section.

FIG. 3 illustrates an alternative approach by which a built-in effective chirp is introduced into the first DBR section 306 of the single-mode DBR laser 300. In contrast to the laser 200 of FIGS. 2A and 2B, the DBR section 306 of the laser 300 has an optical waveguide 330 of constant width. An effective chirping of the grating 328 is induced by curving the optical waveguide 330 in the first DBR section 306, such that light travelling along the waveguide experiences a monotonically and continuously increasing effective grating pitch as it travels along the optical waveguide away from the gain section 302 (the grating lines remain parallel, and do not curve round in correspondence with the optical waveguide). In the illustrated embodiment, the change in the effective grating pitch of the optical waveguide varies by less than 0.5% along the length of the DBR section 306.

Figure 4:
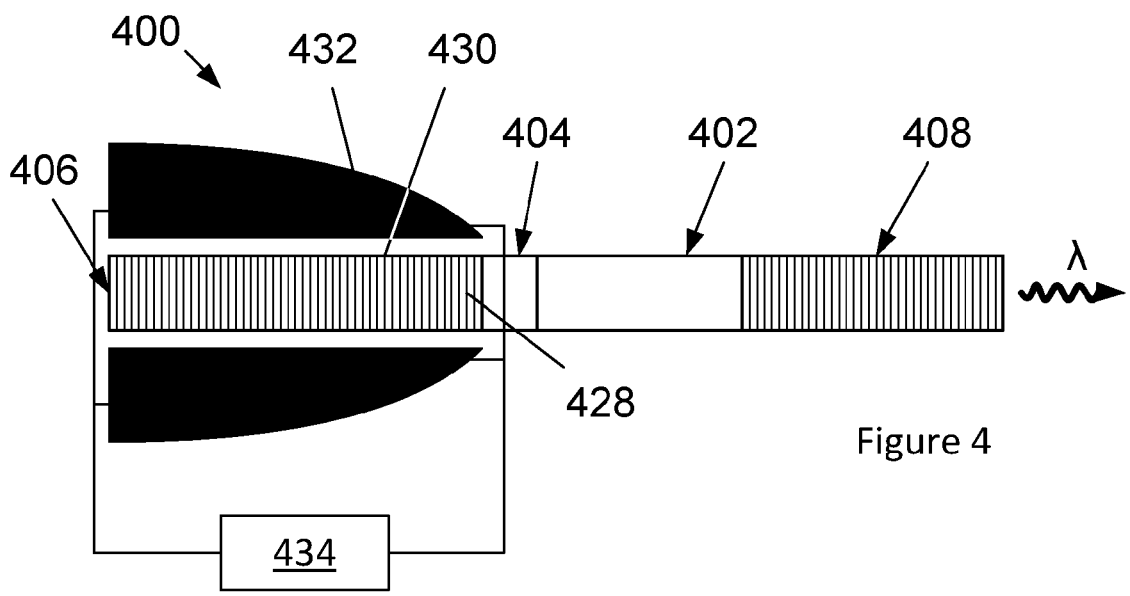
FIG. 4 shows a schematic plan view of a four section DBR laser according to the present invention, having a tapered resistive element on the DBR section.

FIG. 4 illustrates a further approach to compensate for the inhomogeneous optical absorption of light in the first DBR section 306 of a four section DBR laser 400. In this single-mode DBR laser 400, an electrically resistive heating element 432 (shown in two parts that are arranged either side of the ridge waveguide 430) is provided adjacent the ridge waveguide 430. The resistive element 432 is adapted to produce heat with a thermal dissipation per unit length that increases monotonically and continuously along its length, away from the gain section 402. In use, the resistive element 432 is driven to generate heat in the ridge waveguide 430 with a thermal dissipation profile that complements the heat resulting from the inhomogeneous optical absorption of light and thermal cross-talk. In the illustrated embodiment, the resistive element 432 is configured to produce thermal dissipation equivalent to a change in the effective grating pitch of the optical waveguide of less than 0.5% along the length of the DBR section 406. Advantageously, the level of thermal balancing provided by driving the resistive element may be adjusted in accordance with the operating conditions of the laser.

The resistive element 432 monotonically increases in width along its length, away from the gain section 402. In the illustrated embodiment, the width of each part of the resistive element 432 increases in accordance with an exponential growth function. Alternatively, the resistive element may taper linearly, or in an approximation to the exponential growth function comprising a first tapered section and a second section that is less tapered or has constant width (other intervening sections may be provided to produce a better approximation). In a further alternative, the thickness or composition of the resistive element 432 may change along its length.

It will be appreciated that the different approaches to providing chirp in a DBR grating adopted in each of the embodiments may be combined. In particular, a resistive element for thermally inducing chirp may be combined with built-in chirp to provide an additional correction.

The figures provided herein are schematic and not to scale.

Throughout the description and claims of this specification, the words "comprise" and "contain" and variations of them mean "including but not limited to", and they are not intended to (and do not) exclude other moieties, additives, components, integers or steps. Throughout the description and claims of this specification, the singular encompasses the plural unless the context otherwise requires. In particular, where the indefinite article is used, the specification is to be understood as contemplating plurality as well as singularity, unless the context requires otherwise.

Features, integers, characteristics, compounds, chemical moieties or groups described in conjunction with a particular aspect, embodiment or example of the invention are to be understood to be applicable to any other aspect, embodiment or example described herein unless incompatible therewith. All of the features disclosed in this specification (including any accompanying claims, abstract and drawings), and/or all of the steps of any method or process so disclosed, may be combined in any combination, except combinations where at least some of such features and/or steps are mutually exclusive. The invention is not restricted to the details of any foregoing embodiments. The invention extends to any novel one, or any novel combination, of the features disclosed in this specification (including any accompanying claims, abstract and drawings), or to any novel one, or any novel combination, of the steps of any method or process so disclosed.

The reader's attention is directed to all papers and documents which are filed concurrently with or previous to this specification in connection with this application and which are open to public inspection with this specification, and the contents of all such papers and documents are incorporated herein by reference.

The invention claimed is:

1. A semiconductor distributed Bragg reflector laser configured for single longitudinal mode operation, having an optical waveguide comprising
an optical gain section,
a first reflector being a first distributed Bragg reflector (DBR) section comprising a grating configured to produce a reflection spectrum having a comb of first reflective peaks in an untuned state, and
a second reflector,
wherein the first DBR section is configured to compensate for thermal chirp that is induced inhomogeneously along the length of the first DBR section, in use.

2. The semiconductor distributed Bragg reflector laser according to claim 1, wherein the laser is configured for the full width half maximum of the first reflective peak to be narrower than five times the longitudinal mode spacing at the operating wavelength or across the range of operating wavelengths.

3. The semiconductor distributed Bragg reflector laser according to claim 1, wherein the grating of the first DBR section has a built-in effective chirp.

4. The semiconductor distributed Bragg reflector laser according to claim 3, wherein the built-in effective chirp is less than 0.5% along the first DBR section.

5. The semiconductor distributed Bragg reflector laser according to claim 3, wherein the built-in effective chirp is selected from the group consisting of:
- an exponential growth function along the length of the first DBR section away from the gain section,
- a linear growth function along the length of the first DBR section away from the gain section, and
- a composite growth function along the length of the first DBR section away from the gain section comprising at least a first portion adjacent the gain section having a first linear growth function and a section portion having either a lower second linear growth function or no built-in effective chirp.

6. The semiconductor distributed Bragg reflector laser according to claim 3, wherein the grating of the first DBR section has a constant pitch.

7. The semiconductor distributed Bragg reflector laser according to claim 3, wherein the first DBR section comprises an optical waveguide having a grating with a chirped physical pitch.

8. The semiconductor distributed Bragg reflector laser according to claim 3, wherein the first DBR section has a waveguide width that increases away from the end of the first DBR section closest to the gain section.

9. The semiconductor distributed Bragg reflector laser according to claim 8, wherein the waveguide width increases along the length of the first DBR section substantially as an exponential growth function.

10. The semiconductor distributed Bragg reflector laser according to claim 8, wherein the waveguide width increases linearly along the length of the first DBR section.

11. The semiconductor distributed Bragg reflector laser according to claim 1, wherein the first DBR section comprises a curved optical waveguide and the grating has grating lines that are parallel.

12. The semiconductor distributed Bragg reflector laser according to claim 1, wherein the first DBR section comprises a temperature control element configured to heat or cool the first DBR section inhomogeneously along the length of the first DBR section.

13. The semiconductor distributed Bragg reflector laser according to claim 12, wherein the temperature control element is a tapered resistive heating element provided along or alongside the optical waveguide in the first DBR section.

14. The semiconductor distributed Bragg reflector laser according to claim 1, wherein the optical waveguide comprises a ridge optical waveguide.

15. The semiconductor distributed Bragg reflector laser according to claim 1, wherein the second reflector comprises a broadband reflector.

16. The semiconductor distributed Bragg reflector laser according to claim 1, wherein the second reflector comprises a second DBR section configured to produce a second reflection spectrum having at least one second reflective peak, and the or each first reflective peak has a narrower full width half maximum than the or each second reflective peak.

17. The semiconductor distributed Bragg reflector laser according to claim 1, wherein the laser comprises a phase control section.

18. An optical transmitter module comprising the semiconductor distributed Bragg reflector laser according to claim 1.

19. The semiconductor distributed Bragg reflector laser according to claim 1, wherein the first DBR section is configured to produce a reflection spectrum having a comb of first reflective peaks, and the second reflector comprises a second DBR section configured to produce a second reflection spectrum having a comb of second reflective peaks, and wherein the comb of first reflective peaks have a different wavelength spacing from the comb of second reflective peaks.

* * * * *